(12) United States Patent
Yamazaki et al.

(10) Patent No.: US 7,728,368 B2
(45) Date of Patent: Jun. 1, 2010

(54) SEMICONDUCTOR DEVICE AND METHOD OF MANUFACTURING THE SAME

(75) Inventors: Soichi Yamazaki, Yokohama (JP); Koji Yamakawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 3 days.

(21) Appl. No.: 11/706,334

(22) Filed: Feb. 15, 2007

(65) Prior Publication Data

US 2007/0215974 A1 Sep. 20, 2007

(30) Foreign Application Priority Data

Feb. 15, 2006 (JP) ............................... 2006-038248

(51) Int. Cl.
*H01L 21/8242* (2006.01)
(52) U.S. Cl. .................. 257/295; 438/3; 257/E21.664; 257/E21.008
(58) Field of Classification Search ................. 438/239, 438/3, 393, 396, 397, 399; 257/532, 535, 257/295

See application file for complete search history.

(56) References Cited

U.S. PATENT DOCUMENTS 6,635,495 B2 * 10/2003 Hashimoto et al. ............. 438/3
6,762,802 B2 * 7/2004 Ono et al. ..................... 349/38
6,812,042 B2 * 11/2004 Kim et al. ...................... 438/3
2005/0006680 A1 * 1/2005 Song et al. .................. 257/295

FOREIGN PATENT DOCUMENTS

| JP | 2004-311941 | 11/2004 |
|----|-------------|---------|
| JP | 2004-342974 | 12/2004 |

* cited by examiner

*Primary Examiner*—W. David Coleman
*Assistant Examiner*—Shaka Scarlett
(74) *Attorney, Agent, or Firm*—Finnegan, Henderson, Farabow, Garrett & Dunner, L.L.P.

(57) ABSTRACT

According to an aspect of the invention, there is provided a semiconductor device including a semiconductor substrate, a lower electrode film formed on the semiconductor substrate, a dielectric film formed on the lower electrode film, and an upper electrode film formed on the dielectric film, wherein the lower electrode film, the dielectric film and the upper electrode film construct a capacitor in a predetermined region on the semiconductor substrate, the dielectric film is separated from the upper electrode film outside the predetermined region, and the dielectric film is formed continuously with respect to an adjacent cell.

8 Claims, 5 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2006-038248, filed Feb. 15, 2006, the entire contents of which are incorporated herein by reference.

BACKGROUND OF THE INVENTION

1. Field of the Invention

The present invention relates to a semiconductor device and a method of manufacturing the device, more particularly to a capacitor cell structure.

2. Description of the Related Art

FIG. 6 is a sectional view showing a structure of a capacitor cell in a semiconductor device according to a conventional example. In FIG. 6, a silicon substrate 201 is provided with an active region 202. On the silicon substrate 201, a gate 200 is formed which is constructed of a gate oxide film 203, gate electrodes 204, 205 and a gate side wall/cap SiN film 206.

Furthermore, a flattened insulating film 207 is formed which surrounds the gate 200. On the insulating film 207, multilayer interlayer films 208, 209 and 210 are formed. In the insulating film 207 and the multilayer interlayer films 208, 209 and 210, contact holes are formed. In each contact hole, a poly-Si plug 211 and a W-plug 213 (and a barrier layer 212) are formed.

On the multilayer interlayer film 210, a barrier layer (a TiSi film or a TiAlN film) 214 and a lower electrode (an Ir film) 215 of a capacitor are formed so as to be connected to the W-plug 213. In consequence, the active region 202 is connected to the capacitor lower electrode 215 via the poly-Si plug 211, the W-plug 213 and the barrier layer 214.

Furthermore, on the capacitor lower electrode 215, a ferroelectric capacitor insulating film ($Pb(Zr, Ti)O_3$) 216 and a capacitor upper electrode 217 are formed. On the capacitor upper electrode 217, an $Al_2O_3$ film 218 and an $SiO_2$ film 219 are formed. The $Al_2O_3$ film 218 and the $SiO_2$ film 219 function as a mask for processing the capacitor upper electrode 217, the capacitor insulating film 216, the capacitor lower electrode 215 and the barrier layer 214 by reactive ion etching (RIE).

When the capacitor is formed by the RIE processing, a capacitor cover film 220 and an interlayer insulating film 221 are formed so as to surround the capacitor. Furthermore, in the interlayer insulating film 221, a contact 222 and a wiring line 223 are formed so that they extend through the capacitor cover film 220, the second mask film 219 and the first mask film 218 to be connected to the capacitor upper electrode 217 and they electrically couple TE to TE between capacitor cells arranged adjacent to each other (a so-called dual damascene structure).

In addition, it is particularly to be noted that after the interlayer insulating film 221 is RIE-processed and an opening for the contact 222 and a groove for the wiring line 223 are formed, recovery annealing is performed in an oxygen atmosphere at 600 to 650° C. for about one hour to alleviate plasma damages in the capacitor insulating film 216.

In the above conventional capacitor structure, since the surface of the capacitor processed by the RIE process comes into contact with an interface between the upper electrode and the ferroelectric film, the ferroelectric film and an interface between the ferroelectric film and the lower electrode of the capacitor, the capacitor is largely damaged during the etching. Therefore, problems occur that a quantity of signals required for operating the device cannot be obtained, or the signals decrease and reliability of the device deteriorates.

Moreover, there is a problem that a fence is attached to the processed surface during the etching of the capacitor lower electrode, which is a cause for short-circuiting between the upper electrode and the lower electrode or increasing a leak current flowing through the capacitor. The reliability of the device deteriorates.

It is to be noted that in Jpn. Pat. Appln. KOKAI Publication No. 2004-342974, a semiconductor storage device is disclosed. The semiconductor storage device has a data storing capacity element including a lower electrode, a capacity insulating film constituted of a ferroelectric film or a highly dielectric film and an upper electrode successively formed on a semiconductor substrate provided with a transistor; an insulating barrier film to prevent diffusion of hydrogen into the capacity insulating film; a bit line formed on the insulating barrier film; and a bit line load capacity element including a load capacity lower electrode constituted of the lower electrode or an upper electrode, a load capacity insulating film constituted of an insulating barrier film, and a load capacity upper electrode constituted of a bit line.

In Jpn. Pat. Appln. KOKAI Publication No. 2004-311941, there is disclosed a flat plate type capacitor including a lower wiring line formed at a predetermined portion of a semiconductor substrate; a lower electrode electrically connected to the lower wiring line; a concave dielectric film formed in an upper portion of the lower electrode; a concave upper electrode which is larger than the lower electrode and which is formed in an upper portion of the dielectric film; a first upper wiring line electrically connected to the lower electrode; and a second upper wiring line connected to the upper electrode.

BRIEF SUMMARY OF THE INVENTION

According to an aspect of the invention, there is provided a semiconductor device comprising: a semiconductor substrate; a lower electrode film formed on the semiconductor substrate; a dielectric film formed on the lower electrode film; and an upper electrode film formed on the dielectric film, wherein the lower electrode film, the dielectric film and the upper electrode film construct a capacitor in a predetermined region on the semiconductor substrate, the dielectric film is separated from the upper electrode film outside the predetermined region, and the dielectric film is formed continuously with respect to an adjacent cell.

According to another aspect of the invention, there is provided a method of manufacturing a semiconductor device, comprising: forming a lower electrode film on a semiconductor substrate; forming a dielectric film on the lower electrode film; forming an insulating film on the dielectric film and then removing the insulating film from a predetermined region on the semiconductor substrate; and forming an upper electrode film on the dielectric film and the insulating film, whereby the lower electrode film, the dielectric film and the upper electrode film construct a capacitor in the predetermined region; the dielectric film is separated from the upper electrode film outside the predetermined region; and the dielectric film is formed continuously with respect to an adjacent cell.

DETAILED DESCRIPTION OF THE INVENTION

An embodiment of the present invention will hereinafter be described with reference to drawings.

FIGS. 1 to 5 are sectional views showing manufacturing steps of a memory cell in a semiconductor device according to the embodiment of the present invention. Hereinafter, manufacturing steps of a stacked capacitor cell of an FeRAM will be described.

Figure 1:
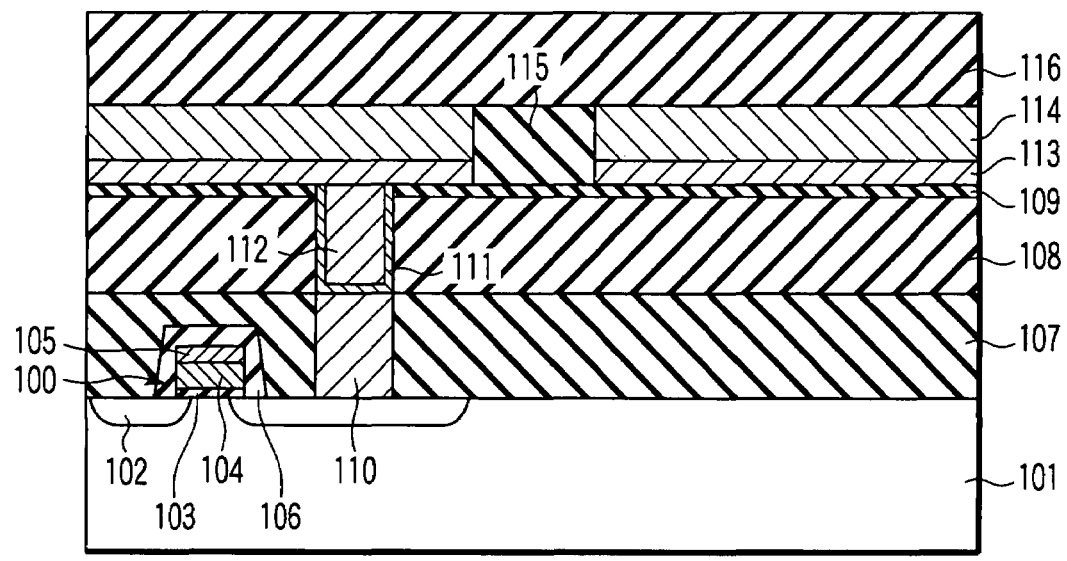
FIG. 1 is a sectional view showing a manufacturing step of a memory cell in a semiconductor device according to an embodiment of the present invention.

As shown in FIG. 1, on a p-type silicon (Si) substrate 101, a groove type element separating film (not shown) is formed. On the silicon substrate 101, there are formed a gate insulating film 103, a gate electrode (e.g., a polycide structure constituted of a poly-silicon film 104 and a $WSi_2$ film 105) constituting a word line, a gate cap film and gate side wall film 106 constituted of a silicon nitride film, and a source/drain diffusion layer 102. In consequence, a MOS transistor is formed.

Furthermore, an interlayer insulating film (an $SiO_2$ film) 107 is formed and flattened so as to surround this transistor. On the interlayer insulating film 107, an interlayer insulating film (an $SiO_2$ film) 108 and an etching stopper film 109 are formed. In these interlayer insulating films 107, 108 and the etching stopper film 109, a contact hole is formed, and contact plugs 110 and 112 are formed in this contact hole. A diffusion preventing film 111 is formed so as to surround the plug 112.

After the contact plug 112 is formed, a barrier layer (a TiAlN film, a TiSiN film, a TaSiN film, a TaN film, or the like) 113 is formed on the etching stopper film 109 by use of a sputtering process. In consequence, the source/drain diffusion layer (an activated region) 102 of the transistor is connected to the barrier layer 113 of a capacitor via the contact plugs 110 and 112. A capacitor lower electrode (an Ir film, an IrOx film, a Pt film, an Ru film, an Rh film, or the like) 114 is deposited on the barrier layer 113 by use of the sputtering process. Subsequently, the capacitor lower electrode 114 and the barrier layer 113 are successively etched using an optical lithography process and an RIE process.

After a resist is removed by ashing, an interlayer insulating film (an $SiO_2$ film) 115 is deposited in the barrier layer 113 and the lower electrode 114 and on the lower electrode 114. Subsequently, the interlayer insulating film 115 is flattened so as to expose the lower electrode 114 by a CMP process. After the CMP treatment, a surface cleaning treatment is performed, and a capacitor dielectric film 116 constituted of a ferroelectric film such as $Pb(Zr, Ti)O_3$ is deposited on the whole surface by use of a CVD process or the sputtering process.

Figure 2:
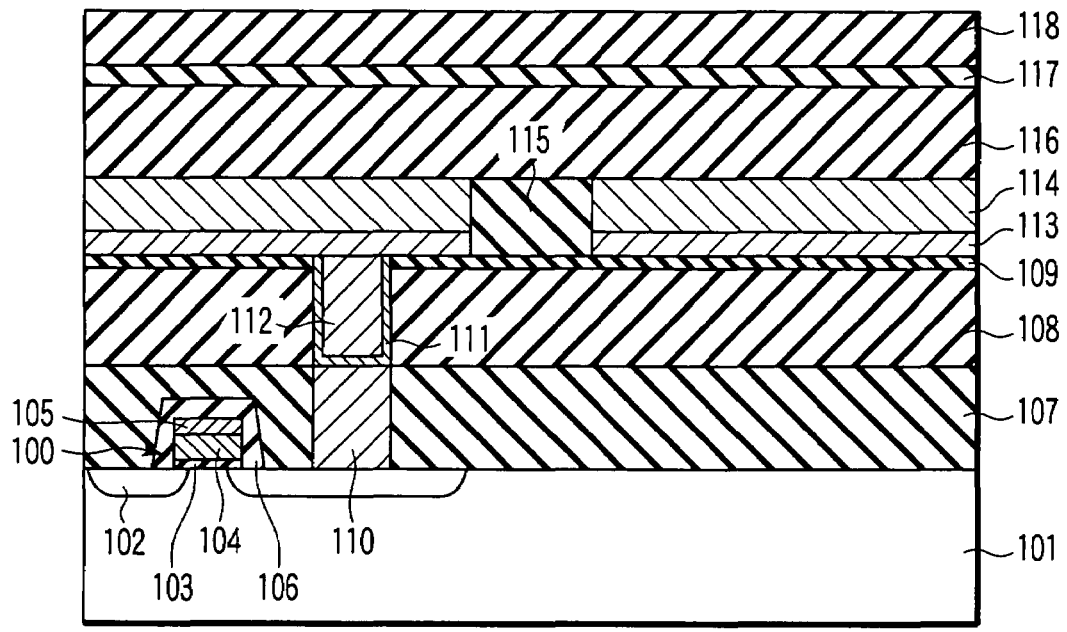
FIG. 2 is a sectional view showing a manufacturing step of the memory cell in the semiconductor device according to the embodiment of the present invention.

Subsequently, as shown in FIG. 2, a contact layer (e.g., an $Al_2O_3$ film or a $Ta_2O_5$ film) 117 and an etching end cover film (an $SiO_2$ film or an insulating film) 118 are successively deposited.

Figure 3:
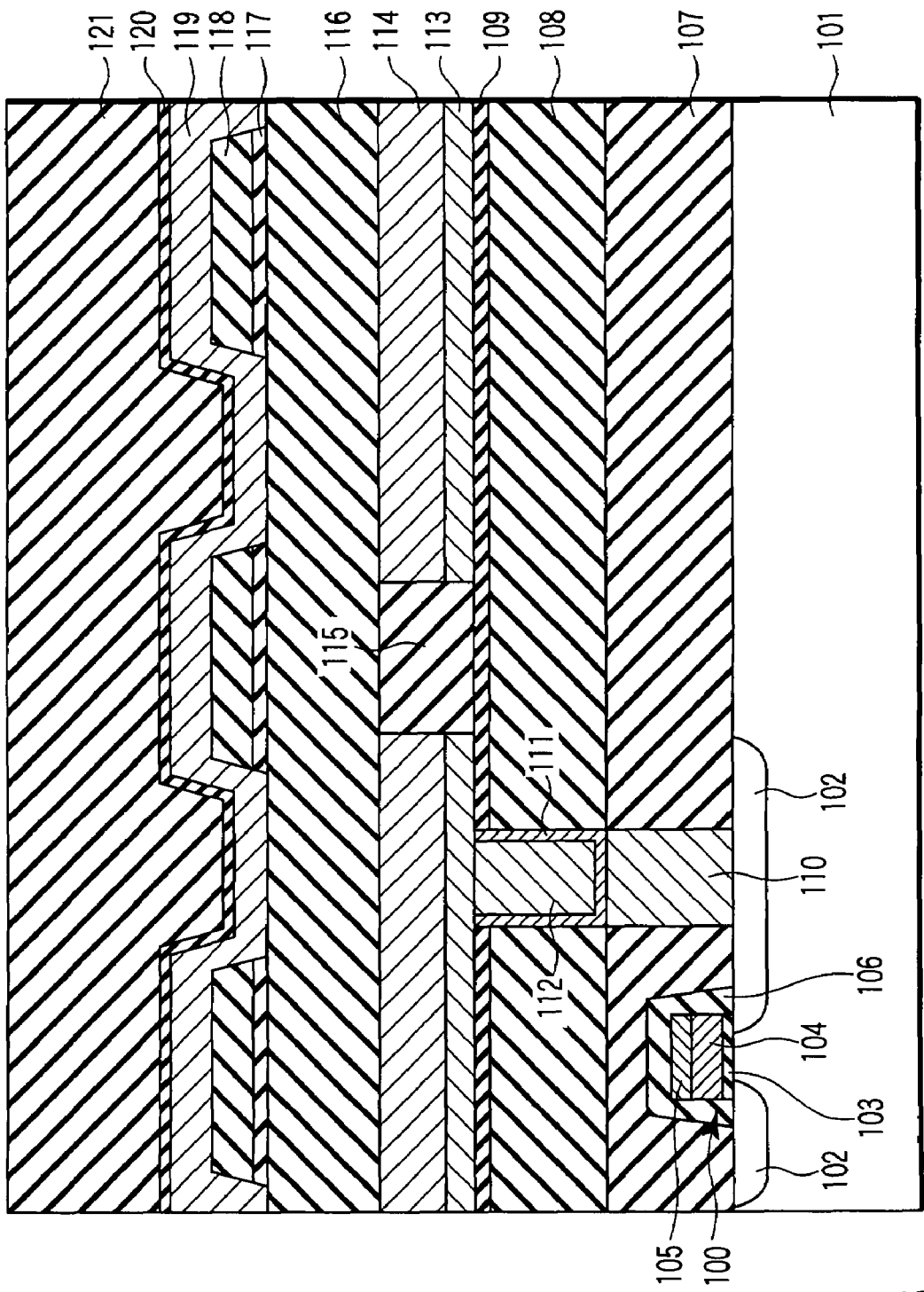
FIG. 3 is a sectional view showing a manufacturing step of the memory cell in the semiconductor device according to the embodiment of the present invention.

Then, as shown in FIG. 3, after patterning of the contact layer 117 and the etching end cover film 118 by the optical lithography process and the RIE process, an ashing treatment is performed to remove a resist mask. In consequence, the contact layer 117 and the etching end cover film 118 are removed from a region where the capacitor is to be constructed.

Next, a capacitor upper electrode (a single-layer film such as an IrOx film, an SRO film or a Pt film, or a laminated film formed by combining these films) 119 is deposited by the CVD process or the sputtering process. Subsequently, a first mask film (an $Al_2O_3$ film, a $Ta_2O_5$ film or the like) 120 and a second mask film (an $SiO_2$ film) 121 are successively deposited.

Figure 4:
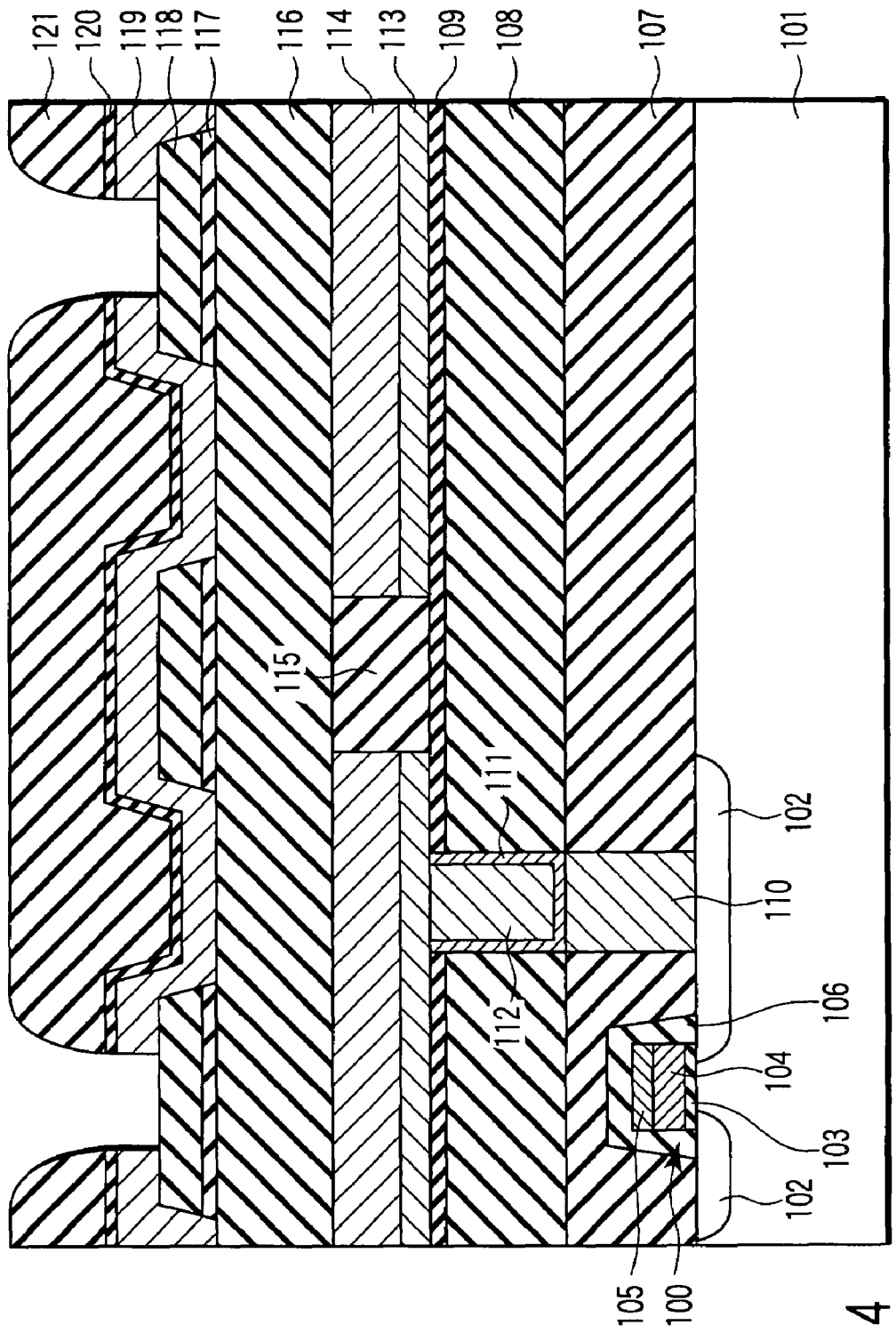
FIG. 4 is a sectional view showing a manufacturing step of the memory cell in the semiconductor device according to the embodiment of the present invention.

Then, as shown in FIG. 4, after patterning of the second mask film 121 and the first mask film 120 by the optical lithography process and the RIE process, an ashing treatment is performed to remove a resist mask. Furthermore, etching of the upper electrode 119 is completely performed by the RIE process using the second mask film 121 and the first mask film 120 as masks to form an upper electrode. At this time, it is ideal that an end point of the etching is disposed in the vicinity of the surface of the etching end cover film 118. However, since a processed groove also serves as an element separating groove on an upper electrode 119 side, and hence it is necessary to completely perform the etching so that any upper electrode film does not remain on the surface of the etching end cover film 118. Thereafter, a rinsing treatment is performed to bring the surface into a clean state.

Figure 5:
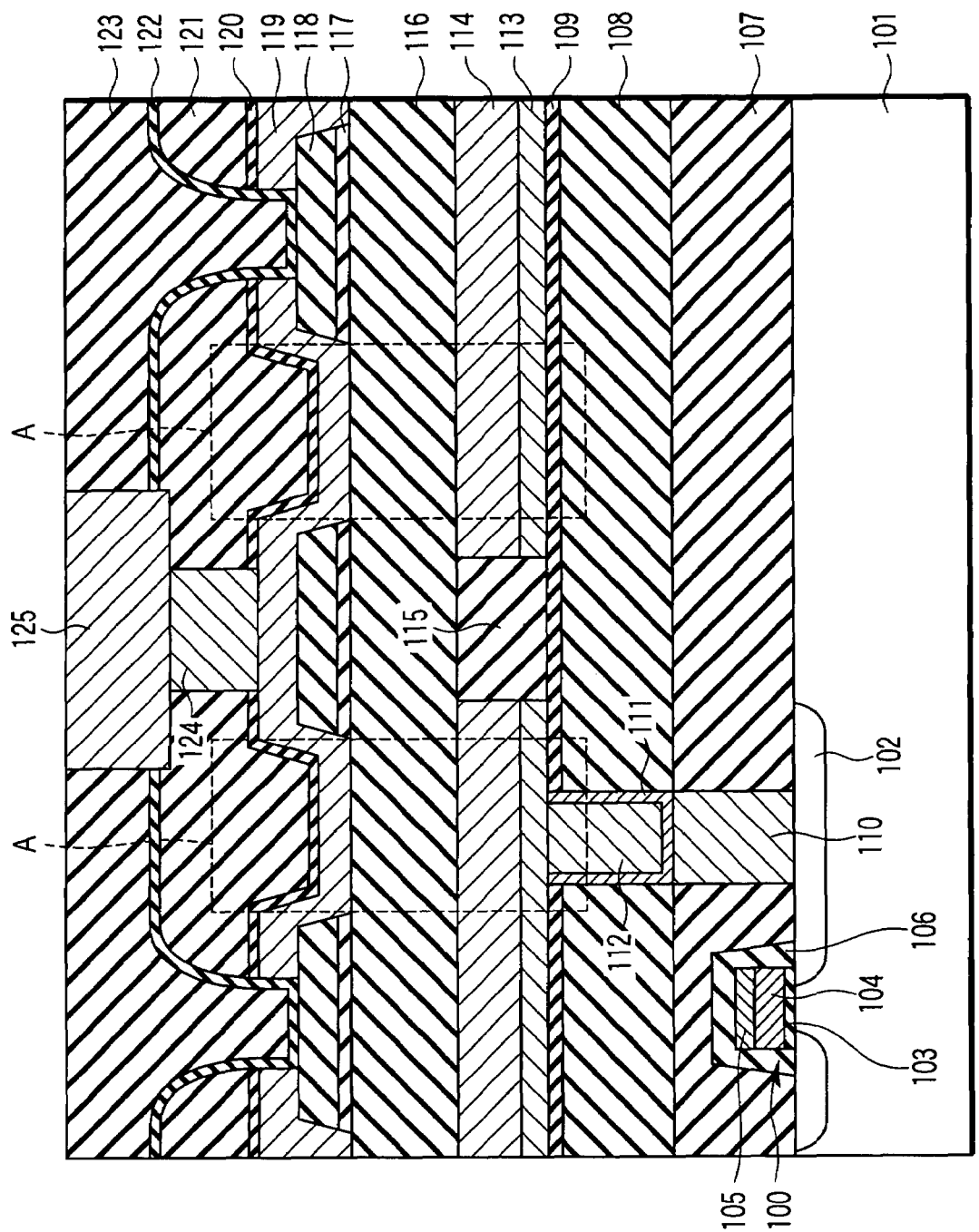
FIG. 5 is a sectional view showing a manufacturing step of the memory cell in the semiconductor device according to the embodiment of the present invention.
Figure 6:
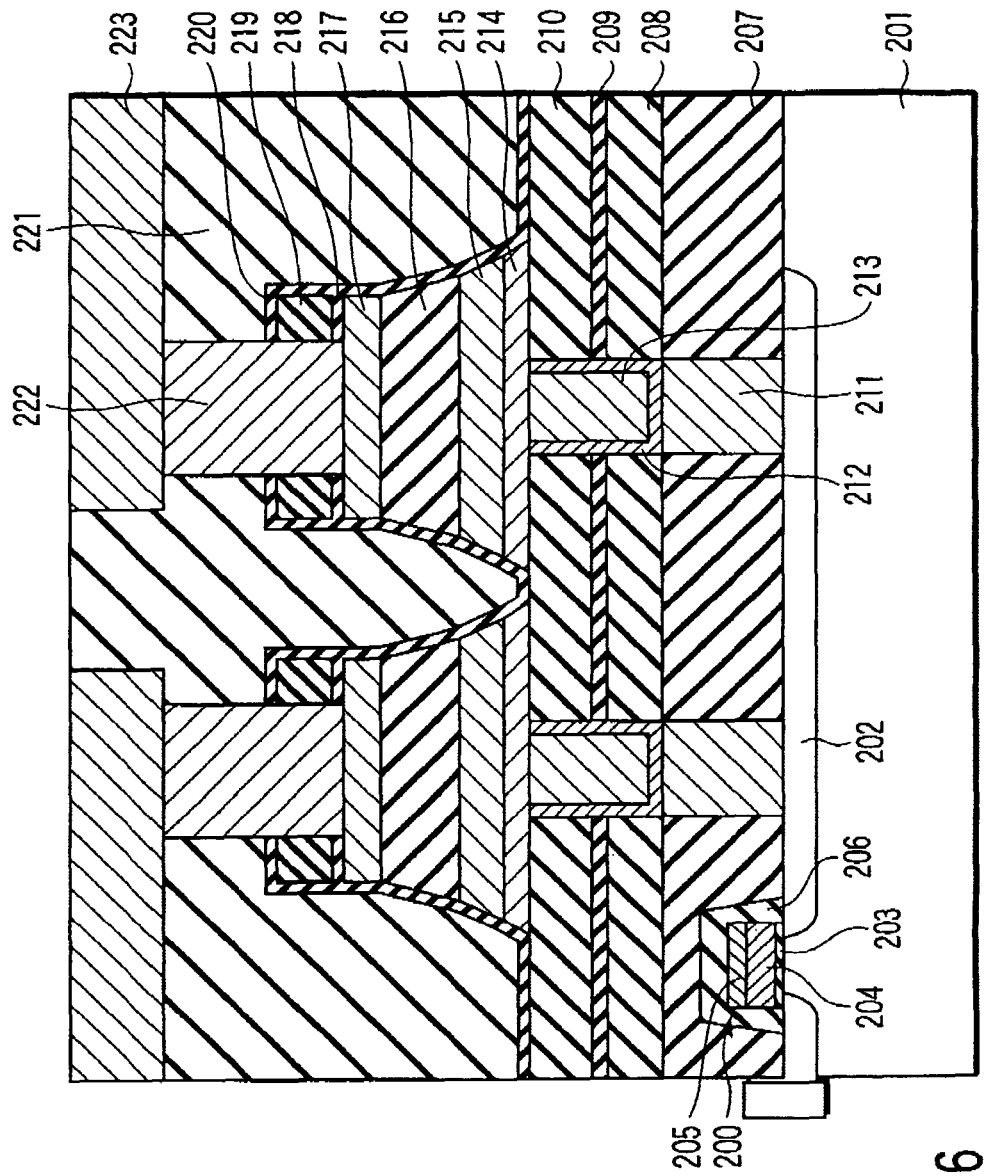
FIG. 6 is a sectional view showing a structure of a capacitor cell in a semiconductor device according to a conventional example.

Then, as shown in FIG. 5, a reduction atmosphere diffusion preventing film (an $Al_2O_3$ film) 122 is deposited using an atomic layer deposition (ALD) process or the sputtering process so as to entirely surround capacitors A, A. On the thus deposited reduction atmosphere diffusion preventing film 122, an interlayer insulating film (an $SiO_2$ film) 123 is deposited, and then flattened by the CMP process. The formation of the reduction atmosphere diffusion preventing film 122 and the interlayer insulating film 123 in an element separating groove on the etching end cover film 118 leads to the formation of an element separating region.

Subsequently, for connection to the capacitor upper electrode 119, a contact hole is formed in the interlayer insulating film 123, the reduction atmosphere diffusion preventing film 122, the second mask film 121 and the first mask film 120, and a wiring line groove to be connected to this hole is formed.

Then, a barrier layer (not shown) of a wiring line and a wiring line film are successively deposited on the whole surface, and the surface is flattened using the CMP process to form a contact 124 and a wiring line 125.

In the memory cell constructed as described above, the capacitors A, A are constructed of the barrier layer 113, the lower electrode 114, the capacitor dielectric film 116 and the upper electrode 119, and formed on the etching stopper film 109. The interlayer insulating film 115 functions as the element separating region on a lower electrode 114 side. On the upper electrode 119, the first mask film 120 and the second mask film 121 for processing the upper electrode 119 are formed on the upper electrode 119 so that these films remain even after the processing of the upper electrode.

The contact layer 117 and the etching end cover film 118 are disposed on the capacitor dielectric film 116 to separate the capacitor dielectric film 116 from the upper electrode film 119 outside a capacitor area, thereby defining the capacitor area. Furthermore, during the RIE etching of the upper electrode 119, an end point is set in the vicinity of the surface of the etching end cover film 118 to determine the end point of the processing. The contact layer 117 and the etching end cover film 118 have a main function of preventing the capacitor dielectric film 116 from being directly damaged during the etching of the upper electrode. On the other hand, the contact layer 117 and the etching end cover film 118 also work as the element separating region on the upper electrode side, and in addition, they perform an important function of determining a size of the capacitor. That is, the capacitor is constructed in a region in which the contact layer 117 and the etching end cover film 118 do not exist. An extent of this region corresponds to an area of the capacitor. The upper electrode film 119 is in such a state of as to ride on the etching end cover film 118 (the insulating film) for processing the upper electrode film. The capacitor dielectric film 116 is formed continuously with respect to an adjacent cell.

Heretofore, in an FeRAM in which a ferroelectric film represented by Pb(Zr, Ti)O$_3$ or the like is used, or in a mixed loading memory to which a ferroelectric capacitor including a ferroelectric material as an insulating film is applied, damage to the capacitor generated during the etching by use of the RIE process has been a serious problem which decreases a quantity of signals.

In the present embodiment, during the formation of the capacitor in the FeRAM or the mixed loading memory, patterning of the flattened capacitor dielectric film on the lower electrode is not performed, and the RIE processed surface of the upper electrode does not directly come into contact with the capacitor dielectric film. Moreover, the upper electrode is deposited on the capacitor dielectric film to thereby determine the area of the capacitor. It can be avoided that the end point (the processed surface) of the RIE to process the upper electrode of the capacitor comes into contact with the capacitor insulating film, and therefore the etching damage to the capacitor insulating film by the RIE can be reduced, so that a sufficient quantity of capacitor signals can be obtained.

As described above, the damage to the capacitor during the RIE in the manufacturing process of the semiconductor device and deterioration of capacitor characteristics by back end damage are prevented, so that reliability of the semiconductor device improves.

According to the present embodiment, it is possible to provide the semiconductor device and its manufacturing method in which the deterioration of the capacitor characteristics by the RIE is prevented.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor device comprising:
   a semiconductor substrate;
   a lower electrode film formed above the semiconductor substrate;
   a dielectric film formed on the lower electrode film;
   a cover film formed in a predetermined region above the dielectric film; and
   an upper electrode film formed so as to cover the dielectric film and at least part of the cover film, the upper electrode film being in direct contact with the dielectric film and the cover film,
   wherein the dielectric film is formed continuously with respect to an adjacent cell and the dielectric film comprises a ferroelectric film.

2. The semiconductor device according to claim 1, wherein an edge of the upper electrode film is located on the cover film.

3. The semiconductor device according to claim 2, wherein the cover film comprises an insulating film.

4. The semiconductor device according to claim 2, further comprising a contact layer formed between the dielectric film and the cover film.

5. The semiconductor device according to claim 4, wherein the contact layer comprises an aluminum oxide (Al$_2$O$_3$) film or a tantalum oxide (Ta$_2$O$_5$) film.

6. A method of manufacturing a semiconductor device, comprising:
   forming a lower electrode film above a semiconductor substrate;
   forming a dielectric film on the lower electrode film;
   forming an insulating film above the dielectric film;
   removing a part of the insulating film in a certain region; and
   forming an upper electrode film so as to cover the dielectric film and at least a part of the insulating film that was not removed, the upper electrode film being in direct contact with the dielectric film and the cover film,
   wherein the dielectric film is formed continuously with respect to an adjacent cell and the dielectric film comprises a ferroelectric film.

7. The method according to claim 6, further comprising:
   processing the upper electrode film by a reactive ion etching (RIE) process, with the insulating film that was not removed being used as an etching end cover film; and
   forming an interlayer insulating film in an element separating region.

8. The method according to claim 6, further comprising forming a contact layer between the dielectric film and the insulating film that was not removed.

* * * * *